(12) United States Patent
Wang et al.

(10) Patent No.: US 9,666,560 B1
(45) Date of Patent: May 30, 2017

(54) MULTI-CHIP MICROELECTRONIC ASSEMBLY WITH BUILT-UP FINE-PATTERNED CIRCUIT STRUCTURE

(71) Applicant: Invensas Corporation, San Jose, CA (US)

(72) Inventors: Liang Wang, Milpitas, CA (US); Guilian Gao, San Jose, CA (US); Hong Shen, Palo Alto, CA (US); Rajesh Katkar, San Jose, CA (US); Belgacem Haba, Saratoga, CA (US)

(73) Assignee: Invensas Corporation, San Jose, CA (US)

( * ) Notice: Subject to any disclaimer, the term of this patent is extended or adjusted under 35 U.S.C. 154(b) by 0 days.

(21) Appl. No.: 14/951,892

(22) Filed: Nov. 25, 2015

(51) Int. Cl.
*H01L 25/00* (2006.01)
*H01L 25/065* (2006.01)
(Continued)

(52) U.S. Cl.
CPC ...... *H01L 25/0655* (2013.01); *H01L 21/4846* (2013.01); *H01L 21/56* (2013.01);
(Continued)

(58) Field of Classification Search
CPC .............. H01L 21/563; H01L 21/6835; H01L 2221/68318; H01L 23/5383; H01L 24/06; H01L 24/38; H01L 24/97; H01L 2224/0233; H01L 2224/0235; H01L 2224/0239; H01L 2224/05001; H01L 2224/83; H01L 2224/94; H01L 2225/1023; H01L 27/12; H01L 2924/1517;
(Continued)

(56) References Cited

U.S. PATENT DOCUMENTS 5,847,936 A 12/1998 Forehand et al.
6,285,079 B1 * 9/2001 Kunikiyo ............ H01L 23/3114
257/737

(Continued)

FOREIGN PATENT DOCUMENTS

DE 19904258 A1 12/1999
WO 2013172814 A1 11/2013
WO 2014066153 A1 5/2014

OTHER PUBLICATIONS

International Search Report and Written Opinion for Application No. PCT/US2016/031207 dated Jul. 21, 2016.

(Continued)

*Primary Examiner* — Bac Au
(74) *Attorney, Agent, or Firm* — Lerner, David, Littenberg, Krumholz & Mentlik, LLP

(57) ABSTRACT

A microelectronic assembly includes a dielectric element having bumps projecting from a first surface thereof, the bumps having end surfaces flush with a planarized encapsulation. A circuit structure having a thickness less than or equal to 10 microns, formed by depositing two or more dielectric layers and conductive layers on the respective dielectric layers, has electrically conductive features thereon which electrically contact the bumps. The circuit structure can be formed separately on a carrier and then joined with the bumps on the dielectric element, or the circuit structure can be formed by a build up process on the planarized surface of the encapsulation and the planarized surfaces of the bumps.

10 Claims, 9 Drawing Sheets

(51) Int. Cl.
- *H01L 23/00* (2006.01)
- *H01L 23/31* (2006.01)
- *H01L 23/367* (2006.01)
- *H01L 21/56* (2006.01)
- *H01L 23/498* (2006.01)
- *H01L 21/48* (2006.01)
- *H01L 21/683* (2006.01)

(52) U.S. Cl.
CPC ...... *H01L 21/6835* (2013.01); *H01L 23/3114* (2013.01); *H01L 23/3675* (2013.01); *H01L 23/49838* (2013.01); *H01L 24/11* (2013.01); *H01L 24/17* (2013.01); *H01L 24/81* (2013.01); *H01L 25/50* (2013.01); *H01L 2221/68345* (2013.01); *H01L 2221/68359* (2013.01); *H01L 2224/116* (2013.01); *H01L 2224/16057* (2013.01); *H01L 2224/16227* (2013.01); *H01L 2224/1703* (2013.01); *H01L 2224/81191* (2013.01)

(58) Field of Classification Search
CPC ........... H01L 2924/181; H01L 23/5389; H01L 23/3121; H01L 25/0655; H01L 2224/07; H01L 2224/73204; H01L 24/82; H01L 2221/6835; H01L 2225/1058; H01L 23/481; H01L 21/4857; H01L 2224/24226; H01L 23/49822; H01L 2224/05572; H01L 25/50; H01L 2224/0401; H01L 2224/05022; H01L 2224/0557; H01L 2224/18; H01L 2225/06513; H01L 2225/06517; H01L 2225/06541; H01L 25/0657; H01L 2224/13022

See application file for complete search history.

(56) References Cited

U.S. PATENT DOCUMENTS

| | | | |
|---|---|---|---|
| 6,610,934 B2 | 8/2003 | Yamaguchi et al. | |
| 6,711,813 B1 | 3/2004 | Beyne et al. | |
| 6,747,350 B1 | 6/2004 | Lin et al. | |
| 6,879,034 B1 | 4/2005 | Yang et al. | |
| 7,084,487 B1 | 8/2006 | Conn | |
| 7,193,311 B2 * | 3/2007 | Ogawa | H01L 23/3121 257/678 |
| 7,235,477 B2 * | 6/2007 | Ogawa | H01L 21/4857 257/E23.178 |
| 7,791,199 B2 | 9/2010 | Grinman et al. | |
| 7,882,628 B2 | 2/2011 | Muthukumar et al. | |
| 7,902,661 B2 * | 3/2011 | Smeys | H01L 21/4853 257/415 |
| 8,125,065 B2 | 2/2012 | Lee | |
| 8,198,724 B1 | 6/2012 | Wu et al. | |
| 8,486,758 B2 | 7/2013 | Oganesian et al. | |
| 8,952,516 B2 | 2/2015 | Zohni et al. | |
| 9,024,205 B2 | 5/2015 | Uzoh | |
| 9,257,396 B2 * | 2/2016 | Uzoh | H01L 24/02 |
| 2002/0079591 A1 | 6/2002 | Sakiyama et al. | |
| 2004/0080036 A1 | 4/2004 | Chang et al. | |
| 2005/0067680 A1 | 3/2005 | Boon et al. | |
| 2005/0260794 A1 | 11/2005 | Lo et al. | |
| 2006/0033210 A1 | 2/2006 | Chauhan et al. | |
| 2011/0126408 A1 | 6/2011 | Antesberger et al. | |
| 2011/0127664 A1 | 6/2011 | Antesberger et al. | |
| 2011/0133342 A1 | 6/2011 | Arai | |
| 2012/0139094 A1 | 6/2012 | Haba et al. | |
| 2012/0319295 A1 | 12/2012 | Chi et al. | |
| 2013/0083583 A1 | 4/2013 | Crisp et al. | |
| 2013/0093087 A1 | 4/2013 | Chau et al. | |
| 2013/0127054 A1 | 5/2013 | Muthukumar et al. | |
| 2013/0264704 A1 | 10/2013 | Pendse | |
| 2013/0313012 A1 * | 11/2013 | Yang | H01L 21/6835 174/266 |
| 2014/0070423 A1 * | 3/2014 | Woychik | H01L 23/562 257/774 |
| 2014/0231984 A1 | 8/2014 | Chen | |
| 2014/0240938 A1 | 8/2014 | Newman et al. | |
| 2014/0312490 A1 | 10/2014 | Yang et al. | |
| 2016/0300817 A1 * | 10/2016 | Do | H01L 25/50 |
| 2016/0329267 A1 * | 11/2016 | Huang | H01L 23/481 |

OTHER PUBLICATIONS

International Search Report and Written Opinion for Application No. PCT/US2016/031259 dated Jul. 21, 2016.
International Search Report and Written Opinion for Application No. PCT/US2014/018057 dated May 8, 2014.
International Search Report and Written Opinion for Application No. PCT/US2014/067496 dated Feb. 18, 2015.
U.S. Appl. No. 62/159,136, filed May 8, 2015.

\* cited by examiner

MULTI-CHIP MICROELECTRONIC ASSEMBLY WITH BUILT-UP FINE-PATTERNED CIRCUIT STRUCTURE

BACKGROUND OF THE INVENTION

Field of the Invention

The present invention relates to microelectronic packaging and elements thereof more specifically to an assembly for electrically interconnecting and packaging a plurality of microelectronic elements in a common package.

Description of the Related Art

Multi-chip packages which incorporate silicon interposers can be used to provide high speed, high bandwidth or a high degree of parallel interconnections between multiple microelectronic elements arranged side by side above a surface of a common interposer. Silicon interposers are typically formed from a relatively thick wafer in which wiring patterns and contacts are fabricated in a thin layer of the silicon wafer and above the thin layer, after which the bulk of the wafer is ground down or otherwise discarded. As silicon wafers are almost exclusively processed using semiconductor processing equipment in clean rooms, such processing and the discarding of the unneeded bulk wafer can make silicon interposers more expensive and more difficult to fabricate than other types of circuit structures.

In addition, the horizontal area of such multi-chip package can be large. A large size of a package can constrain further miniaturization of a system such as smart phone, tablet, phablet, other handheld device, personal computer or other computer in which the multi-chip package is incorporated.

For example, in an example of a multi-chip package 10 seen in FIG. 1, microelectronic elements 11, 12 and 14 overlie and are electrically interconnected with one another by silicon interposer 20 and are electrically interconnected with a substrate 30 through the silicon interposer 20. Electrical coupling of the silicon interposer with an underlying substrate 30 can be provided through electrically conductive features such as vias which formed typically by drilling through multiple levels of contacts and depositing a metal therein such as by electroless or electrolytic plating or, alternatively, physical or chemical vapor deposition processes.

Auxiliary components such as passive components 40, e.g., decoupling capacitors, and/or resistors can be electrically coupled to the substrate 30 outside the horizontal area of the silicon interposer 20, that is, beyond edges 22 of the silicon interposer. Such components 40 can cooperate with the microelectronic elements 11, 12, 14 of the assembly to provide improved function. As further seen in FIG. 1, a thermally conductive element, i.e., a heat spreader 50, can be thermally coupled to rear surfaces 52 of the microelectronic elements. The heat spreader may also serve as a protective cover for the assembly and the components 40 therein.

FIG. 2 further illustrates electrical and mechanical interconnection of the multi-chip package 10 within a system such as described above. For example, the multi-chip package 30 can be mounted on and electrically connected with a circuit panel 60 through solder balls 61. Clamps 70 may engage the package 10 at a foot portion 54 of the heat spreader and an outwardly facing surface 62 of the circuit panel 60. A further component 80 such as a housing, heat sink, cold plate, cooling duct, or fan can be thermally coupled to a surface 56 of the heat spreader which faces away from the microelectronic elements.

Further improvements in the structure and fabrication of the multi-chip package 10, as well as the horizontal area occupied thereby, would be desirable.

Size (or form factor as commonly quoted in the industry) is a significant consideration in any physical arrangement of chips. The demand for more compact physical arrangements of chips has become even more intense with the rapid progress of portable electronic devices. Merely by way of example, devices commonly referred to as "smart phones" integrate the functions of a cellular telephone with powerful data processors, memory and ancillary devices such as global positioning system receivers, electronic cameras, and local area network connections along with high-resolution displays and associated image processing chips. Such devices can provide capabilities such as full internet connectivity, entertainment including full-resolution video, navigation, electronic banking and more, all in a pocket-size device. Complex portable devices require packing numerous chips into a small space. Moreover, some of the chips have many input and output connections, commonly referred to as "I/Os." These I/Os must be interconnected with the I/Os of other chips. The components which form the interconnections should not greatly increase the size of the assembly. Similar needs arise in other applications as, for example, in data servers such as those used in internet search engines where increased performance and size reduction are needed.

Semiconductor chips containing memory storage arrays, particularly dynamic random access memory chips (DRAMs) and flash memory chips are commonly packaged in single- or multiple-chip packages and assemblies. Each package has many electrical connections for carrying signals, power and ground between terminals and the chips therein. The electrical connections can include different kinds of conductors such as horizontal conductors, e.g., traces, beam leads, etc., which extend in a horizontal direction relative to a contact-bearing surface of a chip, vertical conductors such as vias, which extend in a vertical direction relative to the surface of the chip, and wire bonds which extend in both horizontal and vertical directions relative to the surface of the chip.

As manufacturers of smartphones, tablets and other devices constantly seek increased performance and greater circuit density the trend for these devices is to provide ever greater functional capabilities in an amount of space on a circuit panel that may stay the same or decrease over time. In light of the foregoing, certain improvements can be made in the structure of microelectronic packages and assemblies which comprise a microelectronic package having a memory controller function, or "controller package" as further defined herein. Such improvements may help reduce the amount of space of a circuit panel, e.g., motherboard occupied by the controller and memory packages when such controller and memory packages are mounted in close proximity to one another at non-overlapping areas of the circuit panel.

BRIEF SUMMARY OF THE INVENTION

An assembly in accordance with an aspect of the invention may comprise a dielectric element having first and second oppositely-facing surfaces, a plurality of electrically conductive bumps projecting above the first surface, a plurality of contacts at the second surface, and electrically conductive structure including traces coupling the contacts with the bumps, the traces extending in directions parallel to the first surface. A circuit structure made of a plurality of dielectric layers has oppositely-facing lower and upper surfaces, a plurality of electrically conductive elements at the lower surface coupled with the bumps on the dielectric element, and a plurality of circuit structure contacts at the upper surface facing away from the dielectric element. The circuit structure contacts may be configured for connection with element contacts of each of a plurality of microelectronic elements in a state in which the circuit structure contacts are juxtaposed with the element contacts of the microelectronic elements. The circuit structure may have a maximum thickness of less than 10 micrometers in a direction normal to the lower surface. An encapsulant may contact and surround individual bumps of the plurality of bumps.

In accordance with one or more particular aspects of the invention, the electrically conductive elements of the circuit structure may be deposited onto surfaces of the bumps and the encapsulant. In a particular example, the bumps may comprise substantially rigid metal posts. In a particular example, the encapsulant may be an overmold composition.

In accordance with one or more particular aspects of the invention, a height of the first surface of the dielectric element varies with location on the first surface, and top surfaces of the bumps define a plane such that varying heights of the bumps between the first surface of the dielectric element and the plane compensate for variation in the height of the first surface of the dielectric element. In a particular case, the contacts at the second surface of the dielectric element may comprise second bumps projecting from the second surface in a direction opposite a direction of the bumps projecting from the first surface of the dielectric element, wherein a second encapsulant contacts and surrounds individual ones of the second bumps.

In a particular example, a height of the second surface of the dielectric element varies with location on the second surface, and top surfaces of the second bumps define a plane such that the heights of the second bumps between the second surface and the plane compensate for variations in a height of the second surface of the dielectric element. In a particular example, the second bumps may comprise a bond metal. In a particular example, the second bumps may comprise substantially rigid metal posts.

In accordance with one or more particular aspects of the invention, the circuit structure may comprise first traces adjacent the lower surface thereof, and second traces adjacent to the upper surface, wherein a maximum width of the first traces may be greater than a maximum width of the second traces.

In accordance with one or more particular aspects of the invention, the assembly may further comprise the plurality of microelectronic elements, wherein the circuit structure contacts may be juxtaposed with and joined with the element contacts of the plurality of microelectronic elements. In accordance with one or more particular aspects of the invention, a heat spreader may overlie a surface of the plurality of microelectronic elements at a first height above the circuit structure.

In accordance with one or more particular aspects of the invention, the assembly may further comprise at least one electronic component underlying the lower surface of the circuit structure.

In accordance with one or more particular aspects of the invention, the assembly may further comprise an electronic component of the at least one electronic component disposed between the first surface of the dielectric element and the lower surface of the circuit structure.

In accordance with one or more particular aspects of the invention, the assembly may comprise a peripheral portion of the circuit structure disposed laterally beyond an area aligned with any of the microelectronic elements, wherein the peripheral portion overlies an electronic component of the at least one electronic component.

In accordance with another aspect of the invention, a method is provided making an assembly. Such method may include forming a circuit structure mechanically coupled to a surface of a carrier, which may include forming a first dielectric layer mechanically coupled to the carrier, and forming contacts and a plurality of traces supported by the first dielectric layer. In a particular example, at least some of the traces have first widths less than five micrometers. A second dielectric layer can be mechanically coupled with the first dielectric layer. The circuit structure can have electrically conductive features at a surface of the second dielectric layer, wherein the circuit structure includes a plurality of circuit structure contacts for joining with a plurality of element contacts of each of a plurality of microelectronic elements in a state of the circuit structure contacts being juxtaposed with the element contacts of the microelectronic elements. The method may further comprise electrically coupling the conductive features with a plurality of contacts at a first surface of a dielectric element juxtaposed with the features and the second dielectric layer of the circuit structure. The dielectric element can have at least one dielectric layer. Substantially rigid electrically conductive posts may project above a second surface of the dielectric element opposite from the first surface, the posts electrically coupled with the contacts. The method may also include planarizing ends of substantially rigid conductive posts remote from the second surface of the dielectric element, and separating the circuit structure from the carrier.

In accordance with one or more particular aspects of the invention, the method may further comprise providing an encapsulant layer contacting surfaces of the electrically conductive posts prior to the planarizing, wherein the planarizing removes material of the encapsulant layer and the posts.

In accordance with one or more particular aspects of the invention, a release layer may maintain the circuit structure atop the carrier during formation of the first and second dielectric layers of the circuit structure, and the circuit structure may be separated from the carrier by releasing the release layer.

In accordance with one or more particular aspects of the invention, the traces on the first dielectric layer of the circuit structure may comprise first traces having maximum widths defined by the greatest dimension of each first trace in a direction transverse to a longest dimension of the trace and transverse to a thickness dimension of the trace. The forming the circuit structure can include forming second traces on the second dielectric layer of the circuit structure, the second traces electrically coupled with the first traces and having widths larger than the maximum widths of the first traces.

In accordance with one or more particular aspects of the invention, the electrically coupling of the conductive features with the contacts may be performed simultaneously between the conductive features and a plurality of the dielectric elements. In a particular example, the method further comprise providing an encapsulant contacting opposed edge surfaces of the dielectric elements prior to separating the circuit structure from the carrier.

In accordance with another aspect of the invention, a method of making an assembly is provided. Such method may comprise forming a first structure comprising a dielectric element having first and second oppositely-facing surfaces, and electrically conductive first connectors extending above the first surface. An encapsulant region may be formed overlying the first surface of the dielectric element and surrounding individual ones of the first connectors. Surfaces of the first connectors may be at a surface of the encapsulant region overlying the first surface. The method may further comprise forming a circuit structure, which may include including forming a first dielectric layer overlying the first surface of the dielectric element and mechanically coupled to the encapsulant region. A plurality of first traces may be formed extending parallel to the first dielectric layer and electrically coupled with the first connectors. A second dielectric layer may be formed mechanically coupled with the first dielectric layer, and second traces may be formed supported by the second dielectric layer. Contacts may be formed at a surface of the second dielectric layer facing away from the dielectric element. In a particular example, at least some of the second traces have widths less than five micrometers and the contacts may be configured for joining with corresponding contacts juxtaposed therewith of a microelectronic element overlying the surface of the second dielectric layer.

In accordance with one or more particular aspects of the invention, the method may comprise joining the microelectronic element to the contacts of the circuit structure.

In accordance with one or more particular aspects of the invention, the circuit structure contacts may define a first plane and a height of the first surface of the dielectric element relative to the first plane varies with location on the first surface. The surface of the encapsulant region may define a second plane formed by planarization of the encapsulant and the first connectors, such that variations in a height dimension of the first connectors extending between the first surface and the second plane compensate for height variation of the first surface of the dielectric element relative to the first plane.

In accordance with one or more particular aspects of the invention, the method may comprise forming a planarized second encapsulant region overlying the second surface, the second encapsulant region surrounding individual ones of electrically conductive second connectors extending above the second surface of the dielectric element, wherein surfaces of the second connectors may be at a surface of the second encapsulant region overlying a second surface of the dielectric element. In a particular example, the forming of the first and second encapsulant regions may be performed simultaneously by introducing an encapsulant material into a mold in which the dielectric element is disposed in a state in which the first connectors and the second connectors extend above the first and second surfaces of the dielectric element, respectively.

DETAILED DESCRIPTION OF THE INVENTION

Figure 3:
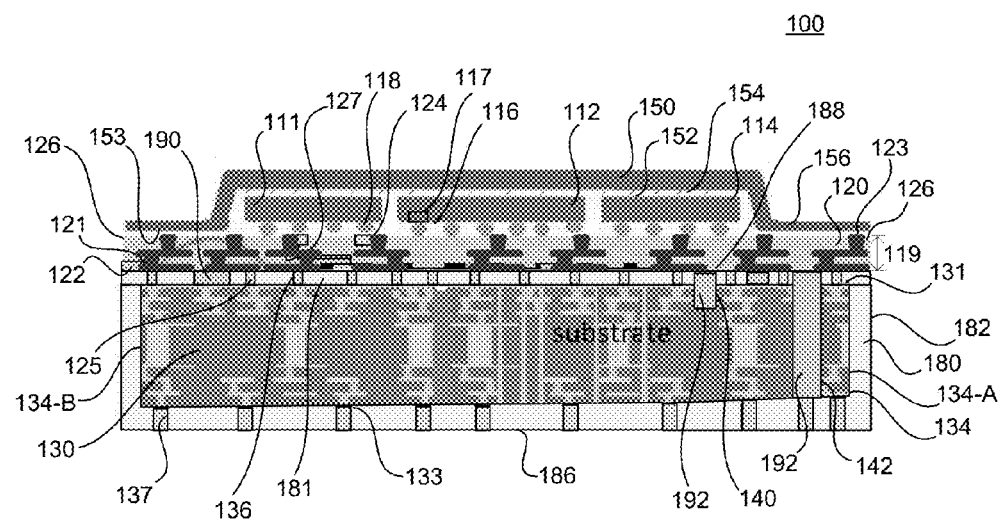
FIG. 3 depicts a multi-chip package in accordance with an embodiment of the invention.

An assembly 100 in accordance with an embodiment of the invention is illustrated in FIG. 3. Assembly 100 comprises a circuit structure 120 made of a plurality of dielectric layers and electrically conductive features 122 at a first surface 121 of the circuit structure. A dielectric element 130 is electrically coupled with the features 122 through bumps 125 which project above the first surface 131 of the dielectric element towards the circuit structure. With the circuit structure being made of dielectric layers rather than semiconductor material, and omitting semiconductor material as a primary material supporting the electrically conductive features, reduced cost and simplified fabrication and other advantages can be obtained as described below. In the circuit structure, the dielectric layers can be formed by depositing and patterning a dielectric material to form electrically conductive traces and contacts thereon having a pitch of less than 2 micrometers, less than 1 micrometer, as low as 0.2 micrometers, or even smaller. In particular examples, the dielectric material can be deposited by chemical vapor deposition ("CVD"), spray coating, spin coating, roller coating, slot die coating, dipping, or the like. In particular examples, the dielectric material can be a photosensitive polymer, e.g., a benzocyclobutene ("BCB")-based material or other photosensitive material. In one example, the circuit structure has a maximum thickness 119 of less than 10 micrometers in a direction normal to the first surface 121 of the circuit structure As further seen in FIG. 3, a plurality of circuit structure contacts 124 at a second surface 123 of the circuit structure 120 opposite the first surface 121 are electrically coupled with conductive elements 122 through electrically conductive features on the circuit structure which includes traces 127. As used in this disclosure with reference to a dielectric element or other component, e.g., circuit structure, interposer, microelectronic element, capacitor, voltage regulator, circuit panel, substrate, etc., a statement that an electrically conductive element is "at" a surface of a component indicates that, when the component is not assembled with any other element, the electrically conductive element is available for contact with a theoretical point moving in a direction perpendicular to the surface of the component toward the surface of the component from outside the component. Thus, a terminal or other conductive element which is at a surface of a substrate may project from such surface; may be flush with such surface; or may be recessed relative to such surface in a hole or depression in the substrate.

In assembly 100 the traces on the circuit structure 120 may have their smallest pitch and their smallest line and space dimensions at positions which are closer to the second surface 123 of the circuit structure than the first surface 121. Thus, traces 127 of the circuit structure 120 which are supported on a dielectric layer adjacent to the first surface 121 of the circuit structure 120 may have maximum widths greater than maximum widths of the second traces that are supported on a dielectric layer adjacent to the second surface 123 of the circuit structure. As used herein, a "width" of an electrically conductive trace is its dimension in a direction transverse to a direction of elongation of the trace and transverse to its thickness on a supporting dielectric layer, the width being measured at any point along the elongation of the trace. As used herein, the "maximum width" of a set of traces is the width of any trace therein which has the greatest width.

Dielectric element 130 may have a single-metal layer or multiple-metal layer structure and may in some cases have a thickness of 0.1 to 5 millimeters in a direction normal to the first surface 131. In a particular example, the dielectric structure of the dielectric element 130 can be reinforced by glass or insulator or semiconductor particles, rods or other such structure embedded within the dielectric material, which can be of or include any or all of epoxies, thermosetting plastics or thermoplastics, polyimide, polycarbonate, polytetra-fluoroethylene ("PTFE"), polymethyl methacrylate ("PMMA"), low-K dielectric materials, e.g., porous dielectric materials, low-K glasses, or other materials. In particular examples, the dielectric element 130 can be of FR-4 or BT resin construction.

The bumps 125 connecting the circuit structure 120 and dielectric element 130 may in one example comprise posts or pins, stud bumps or bond via interconnects each formed of extruded wire, such bumps projecting from surface 131 of the dielectric element towards the circuit structure. Alternatively, the bumps may include or consist essentially of a joining metal such as tin, indium, solder or the like. In a particular embodiment, the bumps may include an electrically conductive composition which includes a metal component such as metal particles or flakes and a polymeric component.

The contacts 124 of the circuit structure can be configured for flip-chip connection with a plurality of element contacts 117 at faces 116 of a plurality of microelectronic elements 111, 112 and 114 overlying different portions of an area of the second surface 123 of the circuit structure. Stated another way, the circuit structure contacts 124 are configured to be joined with the corresponding element contacts 117, such as through electrically conductive bumps 118, in a state in which the circuit structure contacts 124 are juxtaposed with, i.e., face the corresponding element contacts 117 of the microelectronic elements 111, 112 and 114. FIG. 3 illustrates a multi-chip package which includes assembly 100 with the microelectronic elements mounted to circuit structure 120, the bumps 118 providing electrical interconnection between the microelectronic elements and the assembly. The circuit structure 120 also typically provides chip-to-chip electrical interconnectivity, through the electrically conductive features thereon including traces 127, between the respective microelectronic elements 111, 112, 114 within the multi-chip package. Alternatively, an orientation of one or more of the microelectronic elements 111, 112, 114 relative to the circuit structure 120 can be opposite that shown in FIG. 3, in that a rear face of the microelectronic element is oriented towards the second surface 123 of the circuit structure, such that a front face of the microelectronic element having contacts 117 thereon faces away from the circuit structure. In such alternative, electrically conductive structure, e.g., leads or wire bonds extending above the front face electrically couples such microelectronic element with the circuit structure.

However, in another example (not shown), one or more of the microelectronic elements having contact-bearing faces at a greater height from the circuit structure surface 123 than one or more others of the microelectronic elements may partially overlap the one or more other microelectronic elements. For example, the microelectronic elements can be arranged and interconnected with the circuit structure in a manner such as seen in commonly owned U.S. Pat. No. 8,952,516 to Zohni et al., the disclosure of which is incorporated by reference herein.

Figure 2:
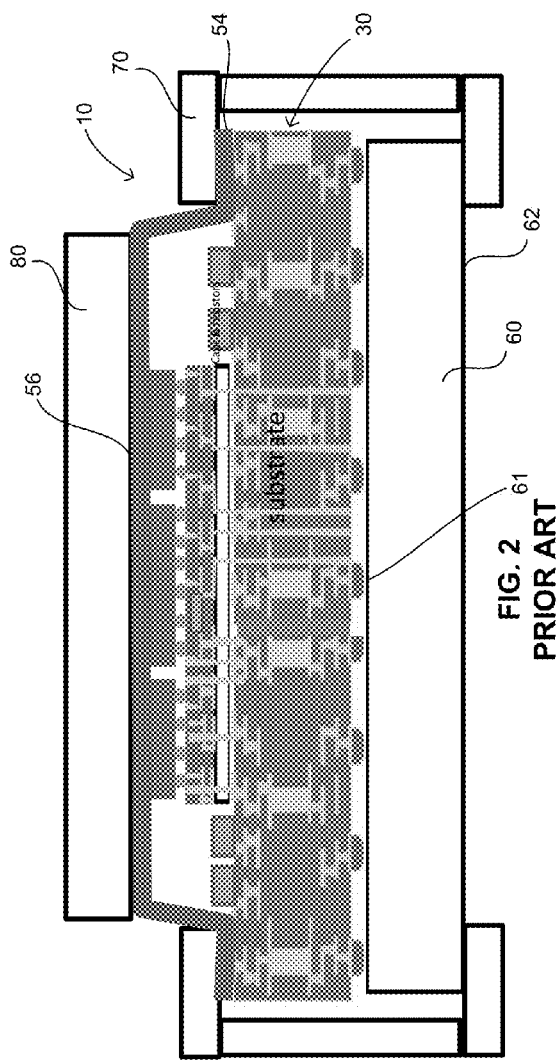
FIG. 2 depicts the multi-chip package of FIG. 1, as further electrically or mechanically interconnected with additional components.

As further seen in FIG. 3, assembly 100 may further include a heat spreader 150 which overlies and is thermally coupled with rear surfaces 152 of the microelectronic elements such as through a thermally conductive adhesive 154 or thermally conductive grease. The heat spreader 150 can include a foot portion 156 which provides a surface to which a clamp 170 (FIG. 4) can be applied, as described above relative to FIG. 2.

Assembly 100 further includes an encapsulant region 180 which may contact peripheral edge surfaces 134 of the dielectric element. An encapsulant region 181 may also be disposed between the facing first surfaces 121 and 131 of the circuit structure and the dielectric element 130, the encapsulant contacting and surrounding individual bumps 125. In one example, the encapsulant region 181 may contact and surround individual bumps 125 and fill spaces between the first surface 121 of the circuit structure and the first surface 131 of the dielectric element 130. Such encapsulant can be an underfill material for mechanically reinforcing connections between the circuit structure and the dielectric element through the bumps 125.

The material of the encapsulant region typically has a composition different from the composition of the dielectric layers of the circuit structure and the dielectric element. In particular embodiments, the encapsulant material is an overmold or potting compound. Such compound can encapsulate edge surfaces and provide stiffness to the assembly and may to withstand internal differential thermal expansion within the assembly 100, or between the assembly 100 and other elements such as the microelectronic elements 111, 112, and 114. The compound may in some cases provide protection from shorting and moisture and/or water resistance. As seen in FIG. 3, the encapsulant can define an edge surface 182 of the assembly 100 which is parallel to a peripheral edge surface 134 of the dielectric element 130.

As seen in FIG. 3, in one example, the microelectronic elements are spaced apart from one another in one or more directions parallel to the second surface 123 of the circuit structure, such that the faces of adjacent microelectronic elements 111, 112, 114 do not overlap and there is some space, which can be small, separating the closest edges of adjacent microelectronic elements from one another.

Figure 4:
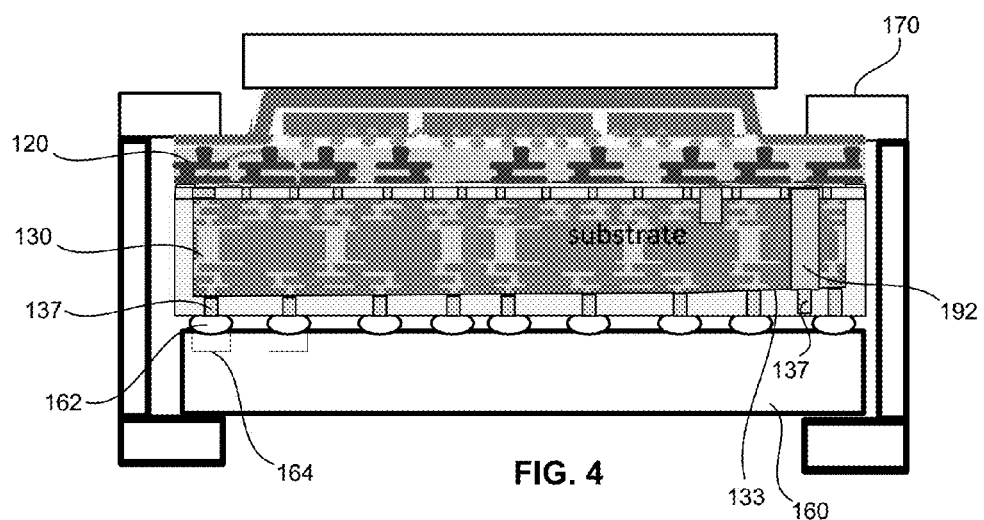
FIG. 4 depicts a multi-chip package in accordance with an embodiment of the invention, as further electrically and mechanically interconnected with additional components.

As further seen in FIG. 4, the assembly can be electrically interconnected with contacts 164 at a surface of a circuit panel 160, such as through joining elements 162 attached to terminals 137 of the dielectric element at a surface 133 which faces oppositely from the surface 131 which faces the circuit structure 120.

Figure 1:
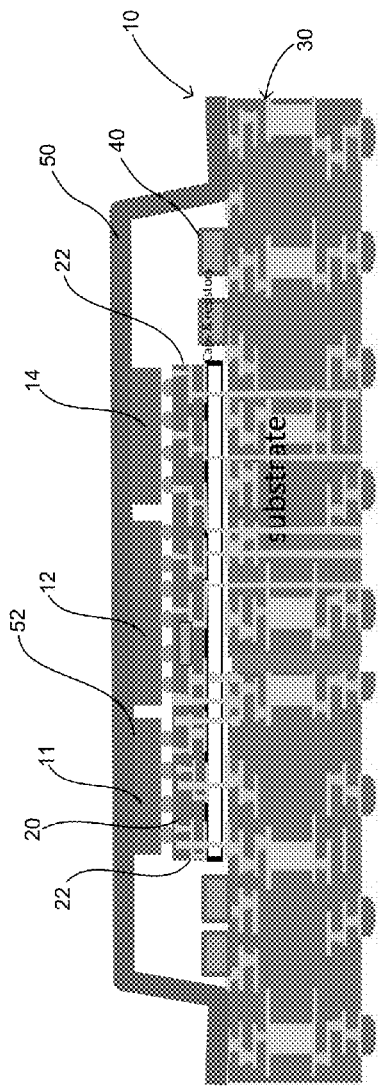
FIG. 1 depicts a multi-chip package in accordance with the prior art.

One or more electronic components, which may be passive components such as capacitors, resistors or inductors, or active components, can be provided in assembly 100. For example, as seen in FIG. 3, a plurality of such components 190 can be disposed underlying the first surface 121 of the circuit structure 120. The components 190 can be embedded in the encapsulant region 181 which occupies a volume of the assembly 100 below the surface 121 of the circuit structure 120 and between the peripheral edges 134 of the dielectric element 130. This differs from electronic components 40 of the assembly 10 (FIG. 1) described in the foregoing. In the foregoing assembly 10, components 40 are disposed only beyond peripheral edges 22 of the silicon interposer. In addition, because the foot portion 156 of heat spreader 150 of multi-chip package 110 is adjacent to surface 123 of the circuit structure rather than a substrate 30 as seen in the above-described assembly (FIG. 1), the one or more electronic components 190 can be disposed within any part of the volume that underlies either the surface 121 of the circuit structure, the heat spreader 150, or both.

In one example, a plurality of electronic components 190 can be disposed just below surface 121 of the circuit structure and embedded within the encapsulation region 180. For example, an electronic component 192 can be disposed at least partially within a recess 140 of the dielectric element extending in a direction below the first surface 131 of the dielectric element. The component 192 may extend from a position adjacent to the first surface 121 of the circuit structure where electrical interconnection can be provided between component 192 and circuit structure 120, but component 192 may not be disposed as close to the surface 121 in all cases. In a further example seen in FIG. 3, a through hole 142 can be provided extending through the dielectric element 130 from first surface 131 of the dielectric element to a second surface 133 of the dielectric element opposite therefrom. The electronic component 192 can extend from a position adjacent to the first surface 121 of the circuit structure where it may be electrically interconnected with the circuit structure. In this way, one or more relatively large components such as a voltage regulator 192 (FIG. 3) can be disposed between one or more peripheral edges 134-A, 134-B of the dielectric element. Alternatively, although not shown, a component such as a voltage regulator 192, could be disposed beyond a peripheral edge 134-A, or 134-B of the dielectric element as embedded within encapsulation region 180. It is also seen that a peripheral portion of the circuit structure can be disposed beyond an area occupied by any microelectronic element and a peripheral edge 126 of the circuit structure.

Referring to FIG. 4, terminals 137, with optionally a plurality of joining elements 162 thereon, can be provided at a surface of the component 192 opposite that which is adjacent to the circuit structure, for joining the electronic component with a corresponding element such as circuit panel disposed below the dielectric element 130 and component 192, i.e., similar to the configuration seen in FIG. 4.

In a variation of the above-described embodiment (not shown), portions of the encapsulant region 180 and the heat spreader 150 can extend beyond the peripheral edge surfaces 126 of the circuit structure in a direction parallel to an upper surface 123 of the circuit structure. Specifically, a foot portion 156 of the heat spreader can extend beyond the edge surface 126 of the circuit structure. In such case, a portion of the encapsulant region 180 extending beyond the edge surface 126 may be thermally coupled with or may contact a downwardly-facing surface 153 of the foot portion 156.

FIG. 3 illustrates another feature of the assembly 100 in which a surface 133 of the dielectric element varies in height relative to the opposite surface 131 of the dielectric element. Thus, surface 133 is depicted having a height which varies from a first height at a first location adjacent to edge 134-A of the dielectric element to a second height at a second location 134-B of the dielectric element. However, a surface 186 of the encapsulant region 180 facing away from the surface 133 of the dielectric element defines a horizontal plane which is parallel to a plane defined by the second surface 123 of the circuit structure. Thus, the encapsulant region extending from the surface 133 of the dielectric element to the planar surface 186 has a variable height above surface 133 which compensates for variations in a height of the surface 133 relative to the plane of the surface 131 of the dielectric element. Bumps 137 extending from surface 133 to the planar surface 186 may also vary in height above the surface 133 such that each bump 137 is disposed uniformly relative to the surface 186 rather than relative to the surface 133. For example, bumps 137 can project a uniform distance above surface 186, be flush with surface 186, or be depressed at a uniform depth below the surface.

Similarly, a surface 188 of the encapsulant region 181 overlying surface 131 of the dielectric element defines a plane parallel to the plane of surface 186, and the height of surface 188 above the surface 131 can vary with the location above the surface 131 to compensate for variations in a height of the surface 131. In addition, bumps 125 extending from a surface 131 of the dielectric element through the encapsulant region to the surface 188 of the encapsulant region 180 can also vary in height with respect to location on the surface 131.

Figure 5:
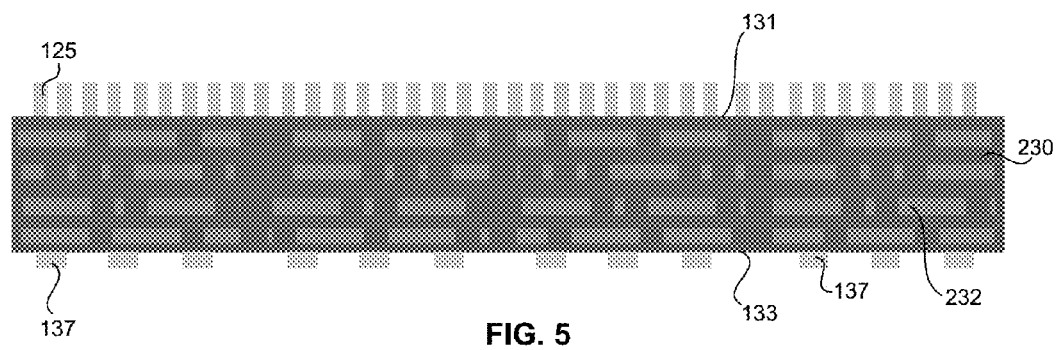
FIGS. 5-8 illustrate stages in a method of fabricating a microelectronic assembly in accordance with an embodiment of the invention.

A method of fabrication according to one embodiment will now be described in accordance with FIGS. 5 through 8. As seen in FIG. 5, a dielectric element 230 has one or more dielectric layers and electrically conductive features thereon including traces 232 extend in a lateral direction parallel to a surface 131 of the dielectric element 230. A plurality of bumps 125 are formed projecting away from the surface 131 and a plurality of bumps 137 are formed projecting away from the surface 133. The bumps can be of any of the types described above relative to FIGS. 3-4. In a particular example, the bumps can be substantially rigid metal posts, such as can be formed by plating a metal, e.g., copper, nickel, gold, or various combinations thereof onto the dielectric element at surfaces 131 and 133. In another example, bumps can be provided on a separate carrier and then joined or bonded to other electrically conductive structure at the surfaces 131, 133.

Figure 6:
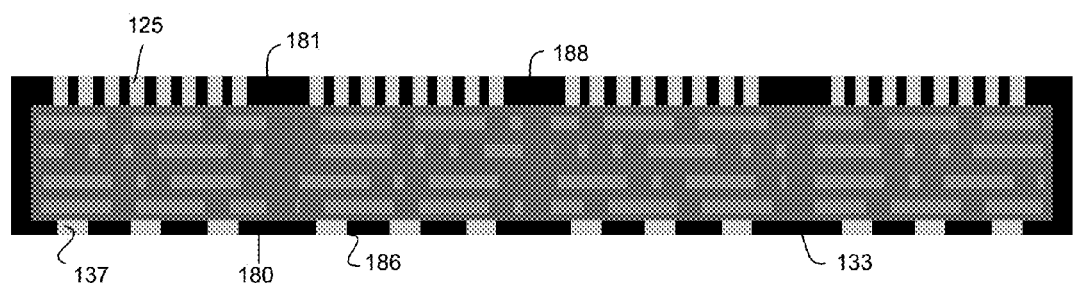

Thereafter, as seen in FIG. 6, an encapsulation region 181 is formed in contact with the bumps 125 and with the surface 131, the encapsulation region surrounding individual bumps 125 from one another and electrically insulating the bumps 125 as well as providing protection from moisture. An encapsulation 180 is also formed in contact with bumps 137 and with surface 133, the encapsulation region surrounding the bumps 137 and providing electrical insulation as well as protection from moisture. Optionally, the encapsulation regions 180 and 181 can be formed simultaneously and the encapsulations may appear and function as one integral encapsulation region rather than two regions.

After providing the bumps 125, 137 and encapsulation regions, the encapsulation regions 180, 181 can be planarized, such as by grinding, lapping or polishing the encapsulation regions to provide planar surfaces 186, 188 which are at least generally parallel to one another. At conclusion of the planarization process, bumps 125, 137 are at the respective surfaces 188, 186 of the encapsulation regions. For example, the bumps may project above, be flush with, or be recessed relative to the respective surface 188 or 186 of the encapsulation that surrounds each individual bump.

Figure 7:
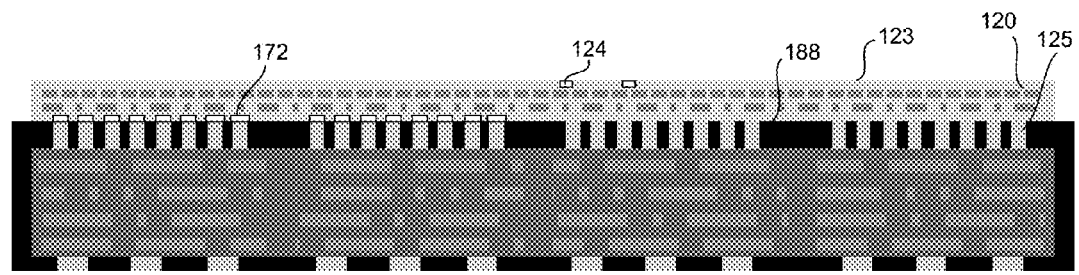

Next, as seen in FIG. 7, circuit structure 120 is provided. In one example, the circuit structure can be formed on the encapsulated dielectric element using a build-up process. In such case, electrically conductive features 172 can be deposited onto surfaces of the bumps 125 at surface 188 and a dielectric layer of the circuit structure can be formed overlying surface 188. In one example, conductive features 172 can be formed directly on the surface 188 after which the dielectric layer can be formed. Alternatively, the dielectric layer of the circuit structure can be formed on the surface 188, after which conductive features can be formed in contact with the bumps 125 through openings in the dielectric layer. One or more additional dielectric layers and additional electrically conductive features, e.g., traces, vias, contacts, of the circuit structure 120 may then be formed, resulting in a set of contacts 124 at a surface 123 of the circuit structure remote from the dielectric element 120.

Figure 8:
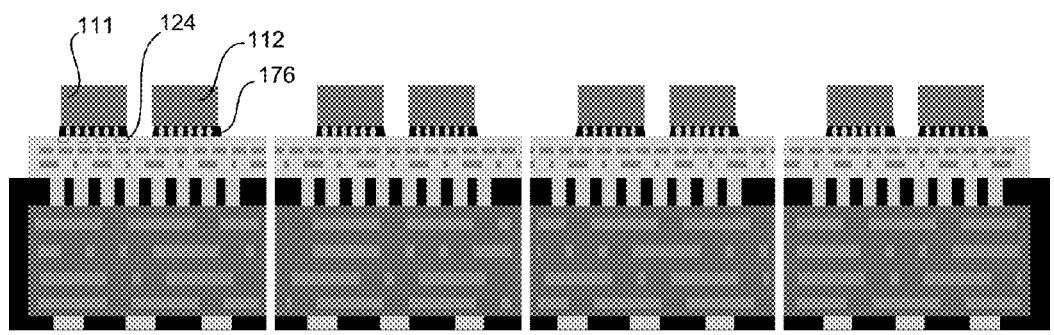

As further seen in FIG. 8, microelectronic elements 111, 112, e.g., bare semiconductor die, can be electrically coupled with the contacts 124, such as through chip connection bumps 176 which join contacts of each microelectronic element 111, 112 with corresponding contacts 124 of the circuit panel juxtaposed therewith. FIG. 8 further illustrates singulation of a larger assembly which includes the dielectric element and circuit structure thereon into a plurality of individual assemblies, each assembly including microelectronic elements, a portion of the circuit structure, and a portion of the encapsulated substrate. Of course, arrangements which include a greater number or smaller number of microelectronic elements per unit are simple to construct and are contemplated herein.

Figure 9:
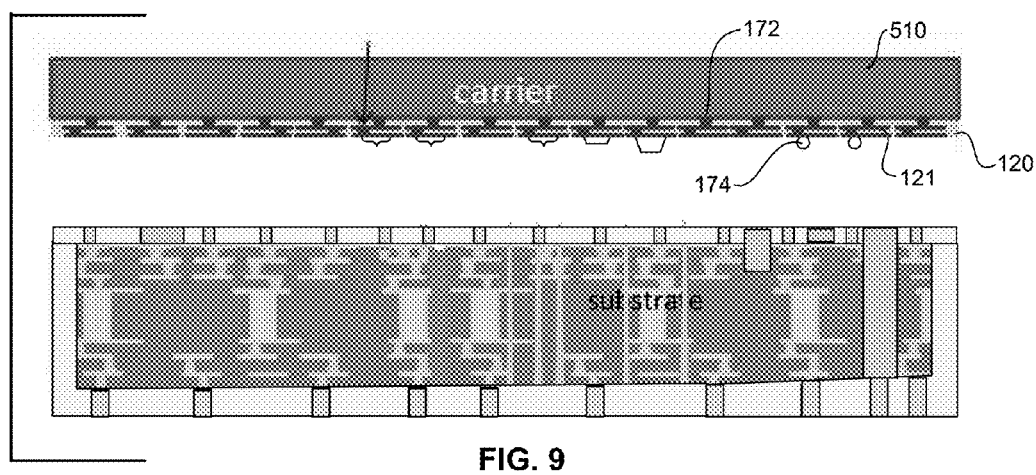
FIGS. 9-10 illustrate stages in a method of fabricating a microelectronic assembly in accordance with an embodiment of the invention.
Figure 10:
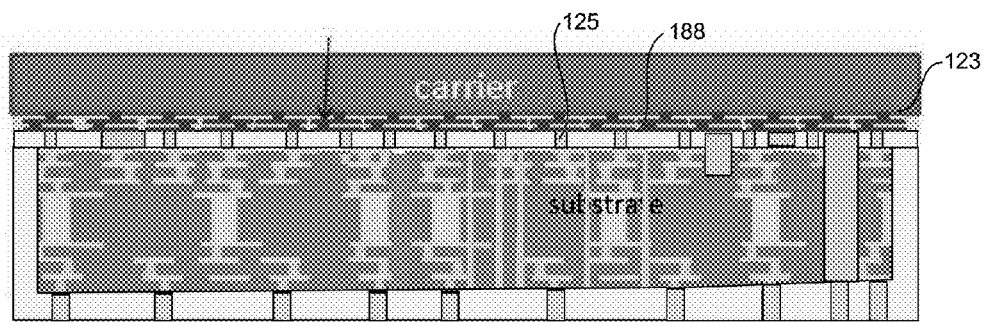

Alternatively, as seen in FIG. 9, the circuit structure 120 can be formed separately on a carrier 510 and then united with the encapsulated dielectric element, such as by joining the bumps 125 at the surface 188 of dielectric region with corresponding electrically conductive elements of the circuit structure. For example, the circuit structure 120 can be fabricated by depositing a dielectric layer and electrically conductive features such as contacts and traces over a surface of the carrier 510 on which a release layer may be provided. The carrier typically is a flat plate-like element of ceramic, glass, or semiconductor composition, or in some cases, an overmold material. The carrier may have a coefficient of thermal expansion of less than 12 parts per million per degree Celsius ("ppm/° C."). The process can be performed so as to form a plurality of dielectric layers and electrically conductive features such as described above with reference to FIG. 3. Typically, features, e.g., traces having finest pitch or finest line and space widths, are formed first and closest to a surface of the carrier, after which traces having pitch or line and space widths larger than the finest pitch and line/space widths are formed. Optionally, joining elements 174, e.g., masses of bonding material, cylindrical or frusto-conical or spherical posts or pins or solder bumps, stud bumps, bumps of extruded wire, or the like, can be formed which extend from a surface 121 of the circuit structure 120. Subsequently, the conductive elements or the optional joining elements thereon can then be united with corresponding bumps 125 at the surface 188 of the encapsulation region to form an assembly as seen in FIG. 10. Thereafter, the carrier can then be removed such that surface 123 of the circuit structure then is exposed and available for mounting microelectronic elements thereon as described above relative to FIG. 3.

Figure 11:
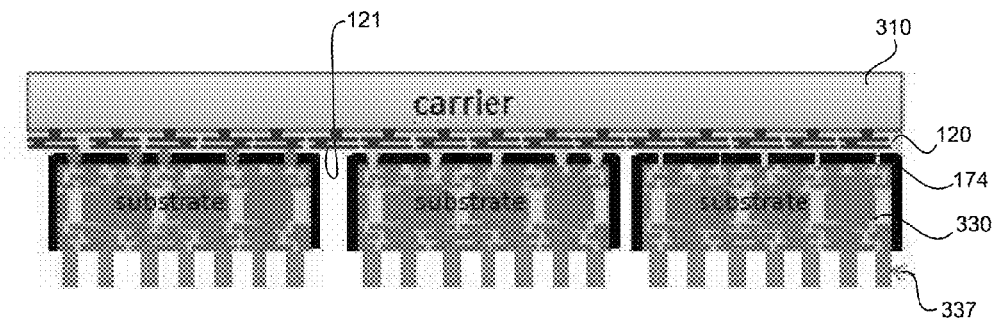
FIGS. 11-15 illustrate stages in a method of fabricating a microelectronic assembly in accordance with an embodiment of the invention.

Referring now to FIG. 11, in a variation of the above-described process, the circuit structure, formed on a carrier 310, has joining elements 174, e.g., bonding metal masses, substantially rigid posts or pins or bumps, e.g., copper or nickel posts or solder bumps, which project away from a surface 121 of the circuit structure 120. The circuit structure is united with a plurality of dielectric elements 330 through the joining elements 174, and a plurality of interconnects 337 are formed (before or after joining through 174) on surfaces of the dielectric elements 330 which face away from the circuit structure.

Figure 12:
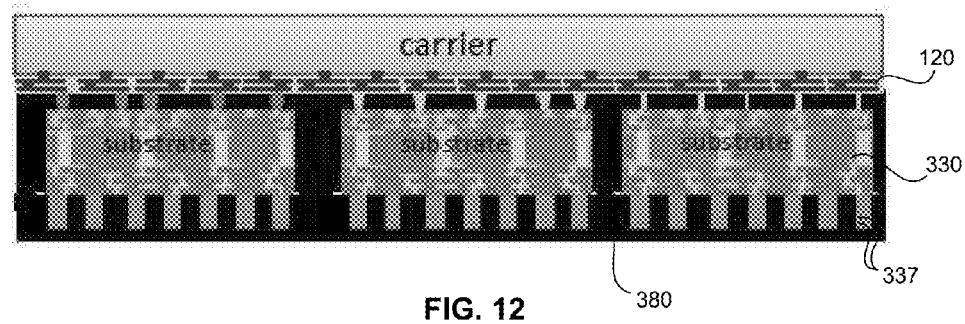

Thereafter, as seen in FIG. 12, an encapsulation region 380 is formed which encapsulates the dielectric elements 330 and the circuit structure 120 together with the interconnects 337. The encapsulation region 380 typically has a stiffening function and can be formed of an overmold material. The encapsulation region can be formed of the materials mentioned above forming the encapsulation regions 180 and 181 in FIG. 6.

Figure 13:
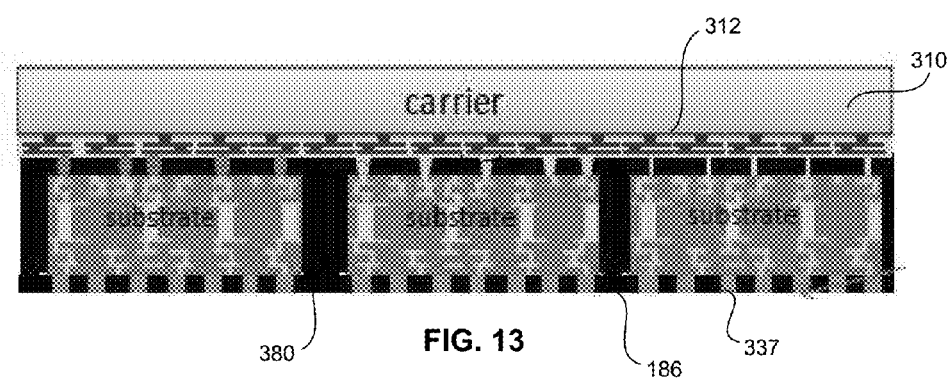

Subsequently, as seen in FIG. 13, the encapsulation region 380 is planarized to a specific height above the carrier 310 such as by grinding, lapping or polishing at a surface 186 thereof, resulting in a structure in which surfaces of bumps 337 have uniform height above a corresponding surface 312 of the carrier 310 which is parallel thereto.

Figure 14:
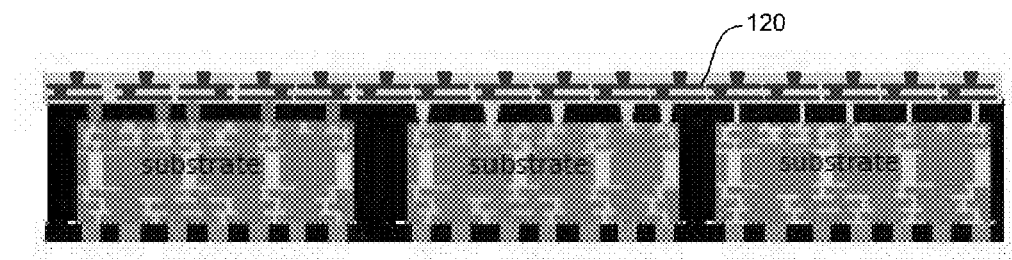
Figure 15:
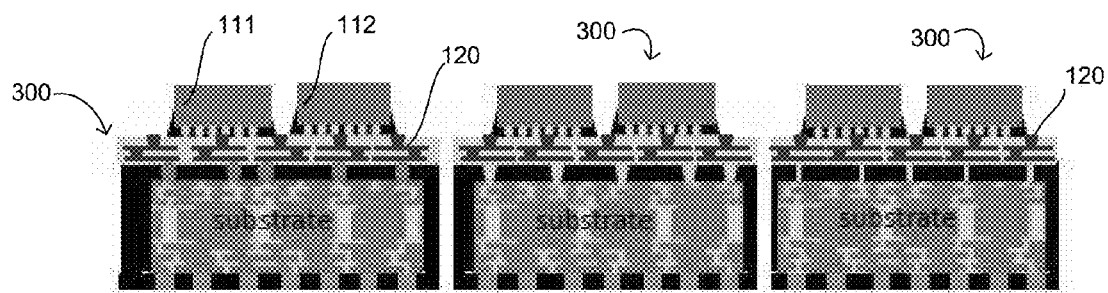

FIG. 14 depicts subsequent removal of the carrier from circuit structure 120, and FIG. 15 depicts the addition of microelectronic elements 111, 112 mounted and electrically coupled with the circuit structure with an optional underfill between microelectronic elements and the circuit structure 120. FIG. 15 further depicts singulation of the assembly into individual assemblies 300.

Figure 16:
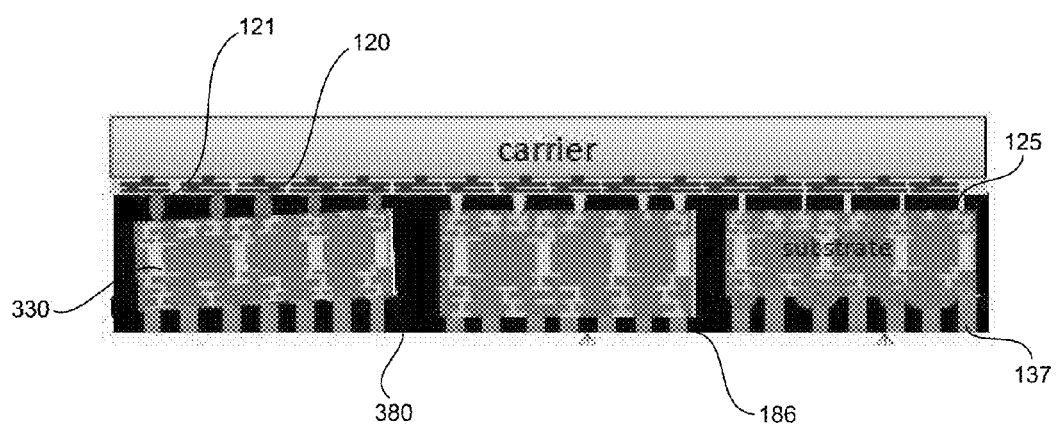
FIG. 16 illustrates an effect of compensation of tilt provided in accordance with an embodiment of the invention.

FIG. 16 further illustrates bumps 125 and 137 extending through the encapsulation 380, the bumps and planarized surface 186 of the encapsulation region 380 compensating for tilt in an orientation of a dielectric element 330 relative to a plane in which the surface 121 of circuit structure 120 lies. FIG. 16 further illustrates bumps 137 above an uneven bottom surface of a dielectric element 330 which is compensated by the planarization of bumps 137 along with surface 186.

Further variations of microelectronic assemblies can be as provided in commonly owned U.S. Provisional Application 62/159,136 filed May 8, 2015, the disclosure of which is incorporated by reference herein.

Figure 17:
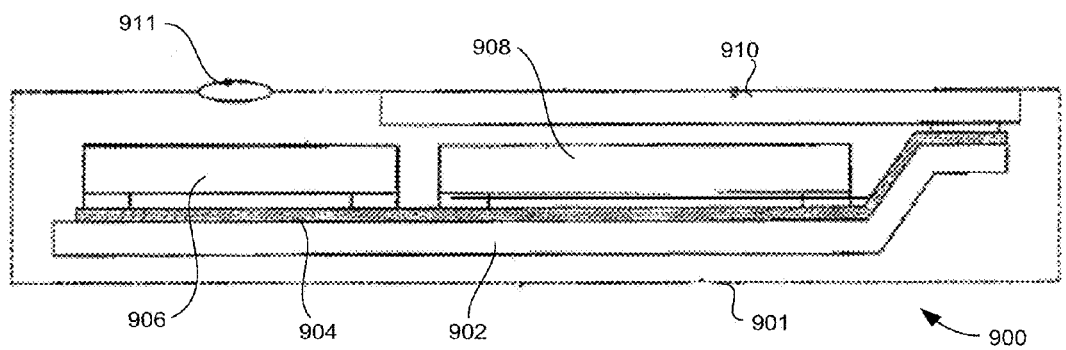
FIG. 17 depicts a system incorporating a multi-chip package in accordance with an embodiment of the invention.

The microelectronic packages and assemblies described above with reference to FIGS. 3, 4, 8, 10 and 15 can be utilized in construction of diverse electronic systems, such as the system 900 shown in FIG. 17. In specific examples and without limitation, a system may be a tablet, smartphone, other mobile device, or notebook or laptop computer or other type of processor-implemented device or computer. For example, the system 900 in accordance with a further embodiment of the invention may include one or more microelectronic packages or assemblies as described above in conjunction with other electronic components 908 and 910.

In the exemplary system 900 shown, the system can include a circuit panel, motherboard, or riser panel 902 such as a flexible printed circuit board, and the circuit panel can include numerous conductors 904, of which only one is depicted in FIG. 17, interconnecting the modules or components 906 with one another. Such a circuit panel 902 can transport signals to and from each of the microelectronic packages and/or microelectronic assemblies included in the system 900. However, this is merely exemplary; any suitable structure for making electrical connections between the modules or components 906 can be used.

In a particular embodiment, the system 900 can also include another component such as the semiconductor chip 908 and component 910 which is a display screen, but any other components can be used in the system 900. Of course, although only two additional components 908 and 910 are depicted in FIG. 17 for clarity of illustration, the system 900 can include any number of such components or their combinations.

Modules or components 906 and components 908 and 910 can be mounted in a common housing 901, schematically depicted in broken lines, and can be electrically interconnected with one another as necessary to form the desired circuit. The housing 901 is depicted as a portable housing of the type usable, for example, in a smartphone or cellular telephone and screen 910 can be exposed at the surface of the housing. In embodiments where a structure 906 includes a light-sensitive element such as an imaging chip, a lens 911 or other optical device also can be provided for routing light to the structure. Again, the simplified system shown in FIG. 17 is merely exemplary; other systems, including systems commonly regarded as fixed structures, such as desktop computers, routers and the like can be made using the structures discussed above.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A method of making an assembly, comprising:
   forming a circuit structure mechanically coupled to a surface of a carrier, the forming including forming a first dielectric layer mechanically coupled to the carrier, forming contacts and a plurality of traces supported by the first dielectric layer, at least some of the traces having first widths less than five micrometers, forming a second dielectric layer mechanically coupled with the first dielectric layer, the circuit structure having electrically conductive features at a surface of the second dielectric layer, wherein the circuit structure includes a plurality of circuit structure contacts for joining with a plurality of element contacts of each of a plurality of microelectronic elements in a state of the circuit structure contacts being juxtaposed with the element contacts of the microelectronic elements;
   electrically coupling the conductive features with a plurality of contacts at a first surface of a dielectric element juxtaposed with the features and the second dielectric layer of the circuit structure, the dielectric element having at least one dielectric layer, wherein substantially rigid electrically conductive posts project above a second surface of the dielectric element opposite from the first surface, the posts electrically coupled with the contacts;
   and planarizing ends of substantially rigid conductive posts remote from the second surface of the dielectric element; and
   separating the circuit structure from the carrier.

2. The method as claimed in claim 1, further comprising providing an encapsulant layer contacting surfaces of the electrically conductive posts prior to the planarizing, wherein the planarizing removes material of the encapsulant layer and the posts.

3. The method as claimed in claim 1, wherein a release layer maintains the circuit structure atop the carrier during formation of the first and second dielectric layers of the circuit structure, and the circuit structure is separated from the carrier by releasing the release layer.

4. The method as claimed in claim 1, wherein the traces on the first dielectric layer of the circuit structure comprise first traces having maximum widths defined by the greatest dimension of each first trace in a direction transverse to a longest dimension of the trace and transverse to a thickness dimension of the trace, wherein the forming the circuit structure includes forming second traces on the second dielectric layer of the circuit structure, the second traces electrically coupled with the first traces and having widths larger than the maximum widths of the first traces.

5. The method as claimed in claim 1, wherein the electrically coupling the conductive features with the contacts is performed simultaneously between the conductive features and a plurality of the dielectric elements, the method further comprising providing an encapsulant contacting opposed edge surfaces of the dielectric elements prior to separating the circuit structure from the carrier.

6. A method of making an assembly, comprising:
   forming a first structure comprising a dielectric element having first and second oppositely-facing surfaces, and electrically conductive first connectors extending above the first surface;
   forming an encapsulant region overlying the first surface of the dielectric element and surrounding individual ones of the first connectors, wherein surfaces of the first connectors are at a surface of the encapsulant region overlying the first surface; and
   forming a circuit structure including forming a first dielectric layer overlying the first surface of the dielectric element and mechanically coupled to the encapsulant region, forming a plurality of first traces extending parallel to the first dielectric layer and electrically coupled with the first connectors, forming a second dielectric layer mechanically coupled with the first dielectric layer, forming second traces supported by the second dielectric layer and forming contacts at a surface of the second dielectric layer facing away from the dielectric element, wherein at least some of the second traces have widths less than five micrometers and the contacts are configured for joining with corresponding contacts juxtaposed therewith of a microelectronic element overlying the surface of the second dielectric layer.

7. The method as claimed in claim 6, further comprising joining the microelectronic element to the contacts of the circuit structure.

8. The method as claimed in claim 6, wherein the circuit structure contacts define a first plane and a height of the first surface of the dielectric element relative to the first plane varies with location on the first surface, wherein the surface of the encapsulant region defines a second plane formed by planarization of the encapsulant and the first connectors, such that variations in a height dimension of the first connectors extending between the first surface and the second plane compensate for height variation of the first surface of the dielectric element relative to the first plane.

9. The method as claimed in claim 6, further comprising forming a planarized second encapsulant region overlying the second surface, the second encapsulant region surrounding individual ones of electrically conductive second connectors extending above the second surface of the dielectric element, wherein surfaces of the second connectors are at a surface of the second encapsulant region overlying a second surface of the dielectric element.

10. The method as claimed in claim 9, wherein the forming of the first and second encapsulant regions is performed simultaneously by introducing an encapsulant material into a mold in which the dielectric element is disposed in a state in which the first connectors and the second connectors extend above the first and second surfaces of the dielectric element, respectively.

* * * * *